United States Patent
Strobel et al.

(10) Patent No.: US 12,009,839 B2
(45) Date of Patent: *Jun. 11, 2024

(54) CAPACITY ACHIEVING MULTICARRIER MODULATION AND CODING SYSTEMS AND METHODS

(71) Applicant: MAXLINEAR, INC., Carlsbad, CA (US)

(72) Inventors: Rainer Strobel, Munich (DE); Vladimir Oksman, Morganville, NJ (US)

(73) Assignee: MaxLinear, Inc., Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/810,832

(22) Filed: Jul. 5, 2022

(65) Prior Publication Data

US 2022/0352906 A1    Nov. 3, 2022

Related U.S. Application Data

(63) Continuation of application No. 16/400,273, filed on May 1, 2019, now Pat. No. 11,381,257.
(Continued)

(51) Int. Cl.
*H03M 13/29*    (2006.01)
*H03M 13/00*    (2006.01)
(Continued)

(52) U.S. Cl.
CPC ... *H03M 13/2906* (2013.01); *H03M 13/1102* (2013.01); *H03M 13/1515* (2013.01);
(Continued)

(58) Field of Classification Search
CPC ....... H04L 1/0042; H04L 1/005; H04L 1/006; H04L 1/0065; H04L 27/3411;
(Continued)

(56) References Cited

U.S. PATENT DOCUMENTS

| 6,018,755 A | 1/2000 | Gonikberg et al. |
| 6,944,235 B2 | 9/2005 | Ophir |

(Continued)

FOREIGN PATENT DOCUMENTS

| CN | 1937435 A | 3/2007 |
| CN | 101529836 A | 9/2009 |

(Continued)

OTHER PUBLICATIONS

First Office Action and Search Report in Chinese application No. 2019104339506 mailed Sep. 1, 2023.
(Continued)

*Primary Examiner* — Justin R Knapp
(74) *Attorney, Agent, or Firm* — Buchalter; Jason W. Croft

(57) ABSTRACT

A multi-carrier transmitter apparatus is disclosed. The apparatus includes an outer encoder, a shell mapper and an inner encoder. The outer encoder is configured to receive a signal, perform error correction using an outer code on the received signal and generate an outer encoder signal. The shell mapper is configured to perform constellation shaping on a subset of bits from the outer encoder signal and generate one or more constellation shaping bits. The inner encoder is configured to perform inner error correction/encoding using an inner code on a second subset of bits from the outer encoder signal and generate an inner correction signal.

20 Claims, 9 Drawing Sheets

Related U.S. Application Data

(60) Provisional application No. 62/675,184, filed on May 23, 2018.

(51) Int. Cl.
*H03M 13/11* (2006.01)
*H03M 13/15* (2006.01)
*H04L 1/00* (2006.01)
*H04L 27/00* (2006.01)
*H04L 27/36* (2006.01)
*H04L 27/38* (2006.01)
*H04L 12/28* (2006.01)

(52) U.S. Cl.
CPC ........ *H03M 13/152* (2013.01); *H04L 1/0041* (2013.01); *H04L 1/0057* (2013.01); *H04L 27/36* (2013.01); *H04L 27/38* (2013.01); *H04L 12/2801* (2013.01)

(58) Field of Classification Search
CPC ............. H04L 27/3433; H04L 27/3438; H04L 1/0041; H04L 1/0057; H04L 27/36; H04L 27/38; H04L 12/2801; H03M 13/2906; H03M 13/1102; H03M 13/1515; H03M 13/152
See application file for complete search history.

(56) References Cited

U.S. PATENT DOCUMENTS

| | | |
|---|---|---|
| 6,993,067 B1 | 1/2006 | Betts et al. |
| 7,065,147 B2 | 6/2006 | Ophir et al. |
| 7,072,387 B1 | 7/2006 | Betts |
| 7,106,794 B2 | 9/2006 | Ungerboeck et al. |
| 7,447,984 B2 | 11/2008 | Cameron et al. |
| 9,407,398 B2 | 8/2016 | Batshon et al. |
| 9,698,939 B2 | 7/2017 | Oveis Gharan et al. |
| 11,381,257 B2 | 7/2022 | Strobel et al. |
| 2002/0031190 A1 | 3/2002 | Ophir et al. |
| 2002/0037055 A1 | 3/2002 | Ophir |
| 2006/0236197 A1 | 10/2006 | Lin et al. |
| 2014/0369680 A1 | 12/2014 | Oveis Gharan et al. |
| 2016/0234054 A1 | 8/2016 | Kanter |
| 2016/0352362 A1* | 12/2016 | Fonseka ............. H03M 13/1102 |

FOREIGN PATENT DOCUMENTS

| | | |
|---|---|---|
| RU | 2494539 C1 | 9/2013 |
| TW | 1255608 B | 5/2006 |

OTHER PUBLICATIONS

Office Action issued in European patent application No. 191730670 mailed Aug. 4, 2022.
Office Action issued in European patent application No. 191730670 mailed Mar. 29, 2021.
Extended European Search Report dated Oct. 18, 2019 for European Patent 19173067.0-1220.
Choi, Junil et al. "Noncotierent Trellis Coded Quantization: A Practice Limited Feedback Technique for Massive MIMO Systems." IEEE Transactions on Communications, Voi. 61, No. 12, Dec. 2013.
"Quadrature Amplitude Modulation." ELEX 7860: Wireless System Design. 2013 Winter Session. Corrected Feb. 25, 2013. 3 pages.
"Quadrature Amplitude Modulation (QAM) Constellation." Questtel Technical Systems. 4 pages.
"Reed-Solomon Codes." 13 pages.
"What is QAM: quadrature amplitude modulation." Electronics Notes Incorporating Radio-Electronics.com. 3 pages.

* cited by examiner

| b ($b_{eff}$) | 1 | 2 | 3 | 4 | 5 | 6 | 7 |
|---|---|---|---|---|---|---|---|
| From inner code (206) | $1 \left(\frac{K_{ldpc}}{N_{ldpc}}\right)$ | $2 \left(\frac{2K_{ldpc}}{N_{ldpc}}\right)$ | $2 \left(\frac{2K_{ldpc}}{N_{ldpc}}\right)$ | $2 \left(\frac{2K_{ldpc}}{N_{ldpc}}\right)$ | $2 \left(\frac{2K_{ldpc}}{N_{ldpc}}\right)$ | $2 \left(\frac{2K_{ldpc}}{N_{ldpc}}\right)$ | $2 \left(\frac{2K_{ldpc}}{N_{ldpc}}\right)$ |
| From shaper | - | - | - | - | $3 \left(\frac{3b_{shell}}{K_{shell}} b_k\right)$ | $3 \left(\frac{3b_{shell}}{K_{shell}} b_k\right)$ | $3 \left(\frac{3b_{shell}}{K_{shell}} b_k\right)$ |
| From outer code (202) | - | - | 1 | 2 | 0 | 1 | 2 |

| Input bits | Shell 1 | Shell 2 | sum power | outer shell label |
|---|---|---|---|---|
| 0 | 0 | 0 | 0 | 0 |
| 1 | 1 | 0 | 1 | 0 |
| 2 | 2 | 0 | 2 | 1 |
| 3 | 3 | 0 | 3 | 3 |
| 4 | 0 | 1 | 1 | 1 |
| 5 | 1 | 1 | 2 | 2 |
| 6 | 2 | 1 | 3 | 3 |
| - | 3 | 1 | 4 | - |
| 7 | 0 | 2 | 2 | 2 |
| - | 1 | 2 | 3 | - |
| - | 2 | 2 | 4 | - |
| - | 3 | 2 | 5 | - |
| - | 0 | 3 | 3 | - |
| - | 1 | 3 | 4 | - |
| - | 2 | 3 | 5 | - |
| - | 3 | 3 | 6 | - |

600

| $K_k$ | $b_{shell}$ for $b_k = 2$ | Gain $b_k = 2$ | $b_{shell}$ for $b_k = 2$ | Gain $b_k = 3$ |
|---|---|---|---|---|
| 4 | 6 | 0.56 dB | 8 | 0.65 dB |
| 8 | 12 | 0.71 dB | 16 | 0.88 dB |
| 12 | 18 | 0.75 dB | 24 | 0.91 dB |
| 16 | 24 | 0.8 dB | - | - |

| $K_k^2$ | $b_{shell}$ for $b_k = 2$ | Gain $b_k = 2$ | $b_{shell}$ for $b_k = 2$ | Gain $b_k = 3$ |
|---|---|---|---|---|
| 16 | 6 (22) | 0.72 dB | 8 (28) | 0.88 dB |
| 64 | 12 (52) | 0.85 dB | 16 (120) | 1.03 dB |
| 144 | 18 (210) | 0.87 dB | 24 (276) | 1.07 dB |
| 256 | 24 (376) | 0.92 dB | - | - |

CAPACITY ACHIEVING MULTICARRIER MODULATION AND CODING SYSTEMS AND METHODS

REFERENCE TO RELATED APPLICATIONS

This application is a continuation of U.S. application Ser. No. 16/400,273, filed May 1, 2019, which claims the benefit of U.S. Provisional Application No. 62/675,184, filed May 23, 2018, the contents each of which are herein incorporated by reference in their entireties.

FIELD

Various embodiments generally relate to communications and, more particularly, to modulation and coding for communications.

BACKGROUND

The requirements and expectations for communication devices, such as cable modems (CM), digital subscriber line (DSL) and the like are ever increasing. For example, both higher reliability and higher throughput can be expected and/or required for new designs.

Some techniques utilized with communication include modulation and coding. Modulation involves varying properties of signals, such as carrier signals, to convey information. Coding is a technique that controls or mitigates noise and/or error in communication signals/channels.

What is needed are techniques to facilitate communication by enhanced modulation and coding techniques.

BRIEF DESCRIPTION OF THE DRAWINGS

FIG. 4 is a table 400 illustrating an example generation of QAM symbols in accordance with one or more embodiment.

DETAILED DESCRIPTION

Figure 1:
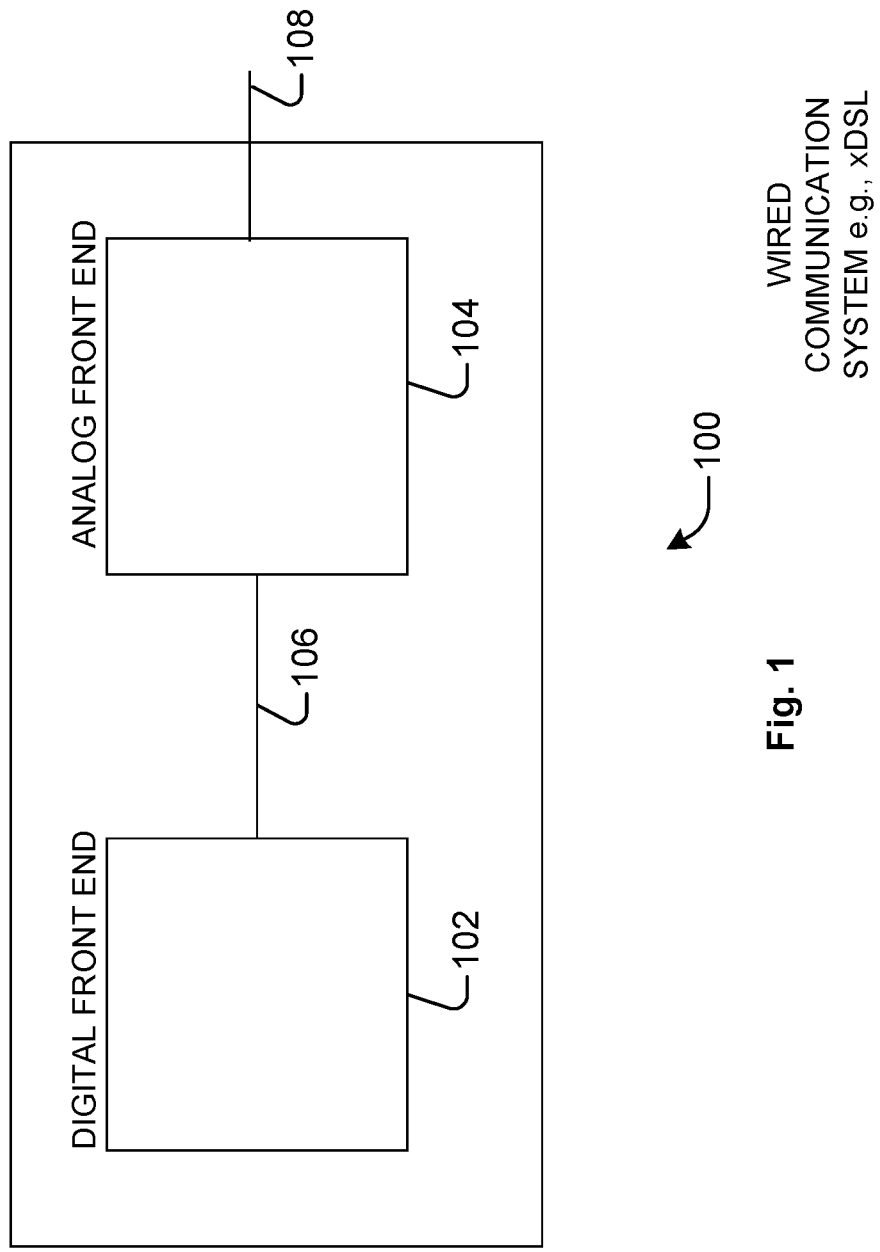
FIG. 1 is a diagram illustrating an example communication system in accordance with one or more embodiments.

The present disclosure will now be described with reference to the attached drawing figures, wherein like reference numerals are used to refer to like elements throughout, and wherein the illustrated structures and devices are not necessarily drawn to scale. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail.

As stated above, enhancements in modulation and coding are needed to further increase data rates and reliability. Generally, modulation involves varying properties of signals, such as carrier signals, to convey information and coding is a technique that controls or mitigates noise and/or error in communication signals/channels.

Communication systems utilize a variety of mediums including cable, air (wireless), twisted pair, copper wires and the like.

For wire based systems, to further increase data rates towards 10 Gbit/s on twisted pair copper wires, the channel capacity should be more efficient. Digital subscribe line (DSL) standards/techniques include xDSL, G.fast and the like. G.fast is a digital subscriber line (DSL) protocol standard for local loops shorter than 500 meters (m).

These DSL systems can use techniques, such as discrete multitoned (DMT) modulation where each carrier is modulated with a per-carrier adjustable QAM constellation, using integer bit allocations between 1 and 12, 14 or 15 bit. To reduce bit error rates and increase efficiency, the data is protected with trellis coded modulation (TCM) as an inner code and Reed-Solomon code as an outer code, with interleaving.

In recent years, capacity achieving forward error correction (FEC) schemes, such as low density parity check code (LDPC), have been introduced in wireless communication standards. However, the application of FEC schemes such as LDPC to transmission on copper wires is problematic, because the channel quality typically varies significantly from the lowest used frequency (highest channel quality) to the highest used frequency (low channel quality).

A coding and modulation scheme used for copper wires is optimized or configured to the low quality channel at low frequencies and the high quality channel at low frequencies with the same FEC coding settings.

Furthermore, a challenge is to achieve high efficiency in the high SNR region (high channel quality), because most error correction coding schemes are optimized or configured for low channel quality (e.g., wireless channels).

Probabilistic constellation shaping is a candidate to improve performance in the high SNR region.

One or more embodiments are included that facilitate communications, particularly wired communications such as two wire or copper line based communications. These embodiments provide high efficiency for higher quality channels and provide suitable noise processing by coding for lower quality channels.

FIG. 1 is a diagram illustrating an example communication system 100 in accordance with one or more embodiments. The system 100 is provided for illustrative purposes and it is appreciated that suitable variations are contemplated.

The system 100 includes a digital front end (DFE) chip 102 and an analog front end (AFE) 104. The DFE 102 and the AFE 104 are connected via an interface and/or signal lines 106. In alternative embodiments, the DFE 102 is a baseband chip and the AFE 104 is a transceiver chip. It is appreciated that the DFE 102 and the AFE 104 can be located on a single chip.

The DFE chip 102 is configured to generate and receive baseband signals. These signals can include a variety of data/information, such as user data, application data, and the like. The DFE chip 102 generates a baseband signal 106 in digital format. Additionally, the DFE chip 102 can receive a signal (received baseband signal) from the AFE 104.

The AFE 104 can be configured for operation with a wired communication, such as DSL, xDSL, g.Fast, DOCSIS, and the like. The AFE 104 is coupled to a medium or infrastructure 108. The infrastructure or medium can include two wires, copper wires, cable and the like.

The AFE 104 generally includes transmitter circuitry, receiver circuitry, modulation circuitry, demodulation circuitry and the like.

The system 100 can be compatible with one or more standards, requirements, specifications and the like. It is also appreciated that suitable variations of the system 100 include use of air as the medium or wireless communication.

Figure 2:
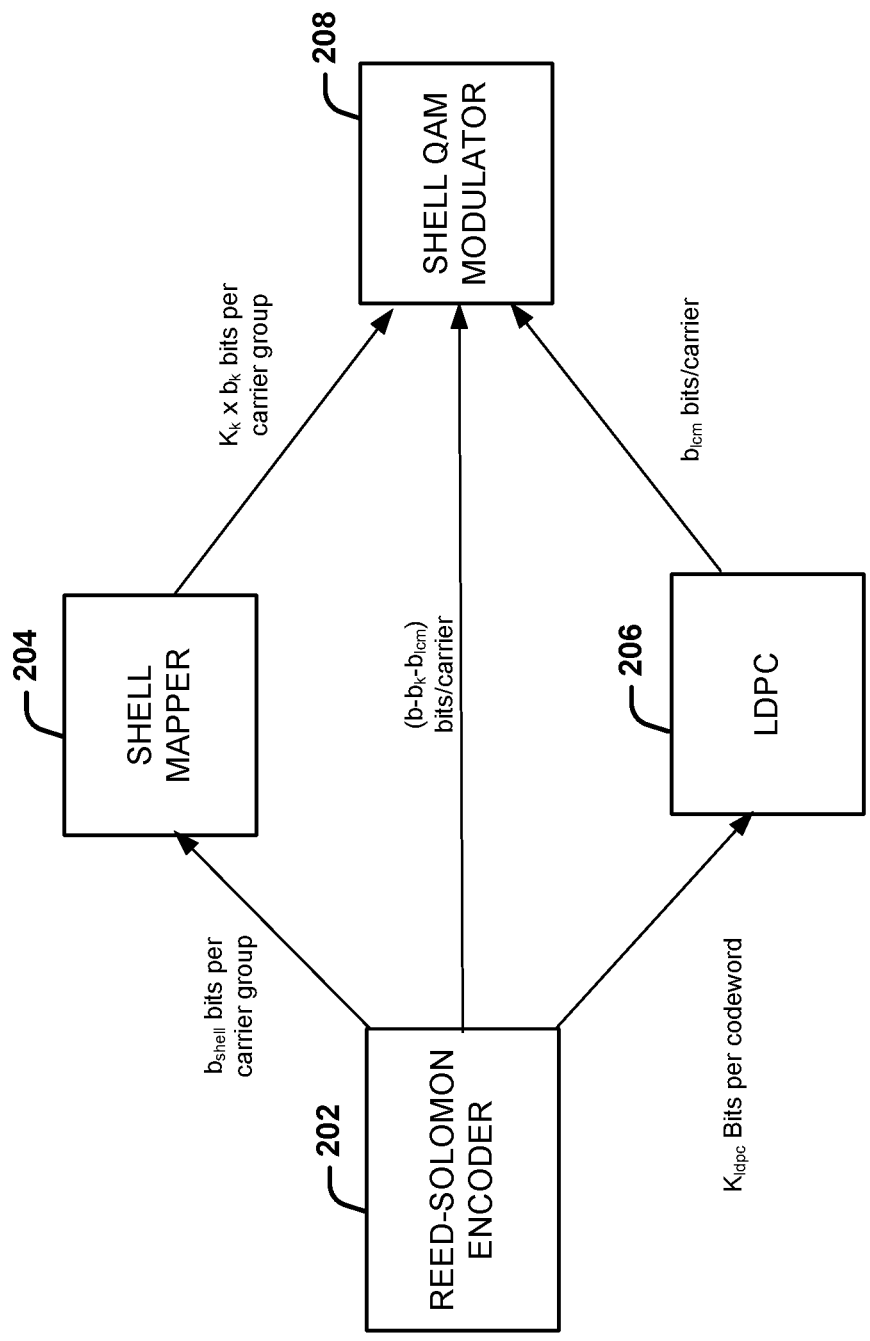
FIG. 2 is a diagram illustrating a shell mapping encoder system using LDPC in accordance with one or more embodiments.

FIG. 2 is a diagram illustrating a shell mapping encoder system 200 using LDPC in accordance with one or more embodiments. The encoder system 200 is provided for illustrative purposes and it is appreciated that suitable variations are contemplated.

The encoder system 200 can be used with the system 100, described above. The system 200 is shown as an encoder for operation with a transmitter. However, it is appreciated that the system 200 can be modified to operate as a decoder for operation with a receiver system.

The encoder system 200 includes an outer (e.g., Reed-Solomon) encoder 202, a shell mapper 204, an inner (e.g., LDPC) encoder 206 and a shell QAM modulator 208.

The system 200 can obtain higher performance than other approaches, such as using Reed-Solomon and TCM for all constellation sizes.

Compared to other inner code, such as LDPC, approaches with all bits protected, an inner or LDPC code used with the system 200 is generally used more efficiently and operates close or near to channel capacity regardless of the SNR and constellation size. Additionally, the LDPC encoder/decoder runs at a lower rate, which is a complexity and power consumption reduction, compared to systems with all bits protected.

With the additional probabilistic constellation shaping used, the efficiency in the high SNR region can be improved. Compared to other shaping schemes, there is no substantial error propagation and the number of bits per symbol is constant for small blocks of carriers and thus, no additional buffering is required.

The system 200 is independent of the inner or outer coding used and as a result, can operate in conjunction with TCM or LCM.

A coding and modulation scheme can be used adapt bit allocations on each carrier to the channel quality on the carrier. Standard QAM constellations generally are unable to modulate bits on carriers that have high SNR. A shaping gap of up to L53d:B is typically present between typical QAM modulation and a capacity achieving (Gaussian) modulation at higher SNR. Probabilistic constellation shaping allows to reduce and even close this gap.

There are several techniques/schemes for probabilistic constellation shaping, e.g. trellis shaping, Huffman coding or shell mapping. However, the shaping scheme is used in combination with the FEC code of choice and respecting the fact that shaping is performed over groups of carriers with different constellation sizes. For a target application using a high speed data connection, e.g., MGfast, targeting WG'bit/:s data rate, the implementation should have reasonable hardware complexity and low power consumption.

The data transmitted over the channel is typically protected by a FEC. In one example, two FEC codes are used, an inner FEC code (LDPC code or Trellis code), which protects only some of the modulated bits that have the highest probability of error, and an outer FEC code, e.g., a Reed-Solomon code, which corrects the remaining bit errors of the inner code and protects the bits which are not protected by the inner code. The probabilistic shaping is selected and parameterized for the given inner and outer FEC coding schemes.

It is appreciated that some xDSL and G.fast systems use QAM with integer numbers of bits allocated on each carrier. Each QAM constellation point is transmitted with the same probability and the bit allocation per carrier is optimized with respect to a requested data rate and a channel quality to achieve a certain target data rate.

To protect and/or mitigate against sudden changes of the noise level or channel changes, some SNR margin is typically used to reduce the data rate and increase the robustness/operation of the link.

In one example, forward error correction (FEC) is implemented with an inner Trellis code, which protects two least significant bits (LSBs) of each constellation and adds 1 bit of overhead per two constellations, thus the overhead is ½ bit per carrier. An outer Reed-Solomon code with interleaving is used to correct Trellis error bursts and errors due to the un-protected bits. The overhead of the Reed-Solomon code is adjusted according to a selected data rate.

It is appreciated that LDPC codes can used instead of Trellis coding as an inner FEC in some applications including mobile phones, 2.5 GBaseT Ethernet and DOCSIS 3.1. By using LDPC, all data bits are/can be protected with the LDPC code with a certain code rate which is selected for a certain signal to noise ratio (SNR) region. The Data Over Cable Service Interface Specification (DOCSIS) 3.1 utilizes an outer code (e.g., Bose-Chaudhuri-Hocquenghem (BCH) code). G.hn (a specification for home networking) uses LDPC codes where the overhead can be adjusted to the average channel quality, but the same overhead is used for all carriers regardless of the actual SNR on each individual carrier.

It is also appreciated that LDPC coded modulation (LCM) can be utilized for very high speed digital subscriber line 2 (VDSL2) and G.fast. With LCM, the LDPC overhead is more optimized for a mix of different constellation sizes, Additionally, it is appreciated that probabilistic constellation shaping can be used in single carrier transmission, e.g. V34 (a modem standard/specification) voiceband modems can be used for other single carrier applications, e.g., fiber.

The system 200 illustrates a coding and modulation framework having probabilistic shaping (the Shell mapper 204), QAM modulation (the modulator 208), inner LDPC code using LCM (the LDPC encoder 206) for inner Trellis Coded Modulation (TCM), and outer Reed-Solomon code (the encoder is proposed.

The bit allocation can be per-tone adjustable. The constellation size can be adjusted in steps of bits or fractions of bits. The constellations can be partitioned into multiple circular shells and the probability for use of the different shells is adjusted by the shell mapper 204 to facilitate capacity.

The shell mapper 204 can operate over small tone groups, e.g., 8, 16, or 32 carriers, to mitigate error propagation.

The LCM can protect some of the LSBs of each constellation (e.g., 2 or 4 LSBs) with an LDPC code with certain/selected overhead (e.g., a rate ¾ code gives ½ bit per carrier overhead or 4 LSBs with a rate ⅞ code gives 1 bit per carrier overhead). The shaping bits are generally not protected with the inner code, such as the LDPC code.

It is appreciated that the shaping bit bits can be protected with an outer code, such as a Reed-Solomon code.

As shown above, the system 200 includes the outer encoder 202, the inner encoder 206, the shell mapper 204 and the modulator 208. The system receives an input signal, which can be a baseband signal and/or other signal, and generates a modulated signal as an output signal.

The outer encoder 202 uses an outer code, such as Reed-Solomon code, BCH code and the like. The outer encoder 202 is configured to perform error correction using the outer code on a received/input signal to generate an outer encoder signal. The inner encoder 206 uses an inner code and protects a number of the modulated bits for small constellations and/or subsets of bits for larger constellations. The inner encoder is configured to perform inner error correction using the inner code on a subset or portion of bits from the outer encoder signal and generate an inner correction signal.

The shell mapper 204 is configured to perform probabilistic shaping and/or constellation shaping on another subset or portion of bits from the outer encoder signal and generate a shell mapper signal. The shell mapper signal can include one or more constellation shaping bits.

The QAM modulator 208 is configured to generate an output signal for transmission based on the received outer encoder signal, the shell mapper signal and the inner correction signal. The modulator 208 can generate one or more modulated symbols in the output signal.

The outer encoder 202 is configured to operate on binary data of the input signal. Each code block of $N_{rs}$ bytes includes $K_{rs}$ data bytes and $R_{rs}$ redundancy bytes. The $N_{rs}$ bytes are also referred to as output bytes.

Multiple Reed-Solomon code blocks ($N_{rs}$ bytes) can be mapped into a single data transmission unit (DTU) and interleaving can be applied within the DTU between different code blocks.

Generally, the DTUs (or single Reed-Solomon (RS) code blocks) are not aligned with the boundaries of DMT or OFDM symbols. One or each DTU can span over multiple symbols or one symbol may contain multiple DTUs. For each RS code block, $K_{rs}$ input bytes from the input bit stream are processed and converted to $N_{rs}$ output bytes: $N_{rs}=K_{rs}+R_{rs}$. The $N_{rs}$ output bytes are processed by the shell mapper 204, the inner coder 206 and the modulator 208.

The inner encoder 206 protects the $b_{lcm}$ least significant bits of each carrier or all bits if number of bits per carrier b is less than or equal to $b_{lcm}$, $b \leq b_{lcm}$ (e.g., if the number of least significant bits is equal to the number of bits per carrier).

The inner code, in this example, is an LDPC code or a Trellis code. If the Trellis code or another convolutional code is used, the inner code is terminated after a certain/selected number of carriers, e.g., the number of carriers K of one DMT symbol, to form one inner code block. If the LDPC code is used as the inner code, the code can be shortened and/or punctured to adjust the block size to the DMT symbol size. Alternately, the block size is independent of the number of carriers and the LDPC block is not aligned with the DMT symbol boundaries.

In general, the inner code creates $b_{lcm} K = N_{ldpc}$ output bits for K carriers (which may or may not match the number of carriers in the DMT/OFDM symbol). For each inner code block, $K_{ldpc}$ bits from the outer code are taken, which depends on the LDPC code rate s<1, such as $N_{ldpc}=K_{ldpc}/S$.

As the inner code is modulated on the $b_{lcm}$ bits $2^{b_{lcm}}$ different constellation points can be distinguished by the inner code. These distinguished constellation points are called the cosets 0, ..., $2^{b_{lcm}}-1$. The coset labels are distributed in the larger QAM constellation where equal coset labels have a maximum distance between each other. This distribution can be achieved if $b_{lcm}$ is even, e.g., $b_{lcm}=2$ or $b_{lcm}=4$.

Figure 3:
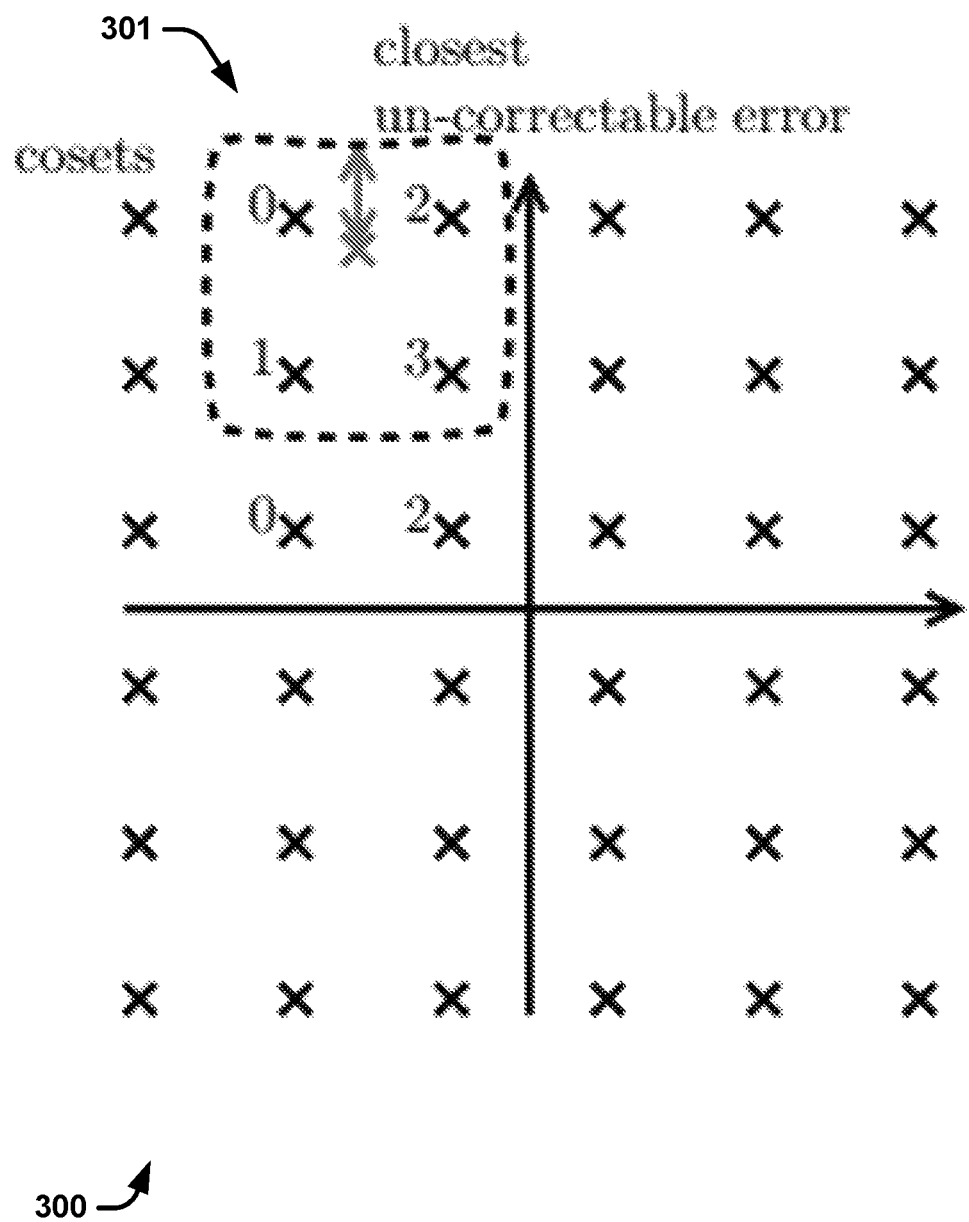
FIG. 3 is a diagram illustrating example cosets for an inner encoder in accordance with one or more embodiments.

An example of cosets is shown in FIG. 3 for $b_{lcm}=2$. However, it is appreciated that other configurations of cosets for the inner encoder 206 are contemplated.

FIG. 3 is a diagram illustrating example cosets 300 for an inner encoder 206 in accordance with one or more embodiments. The examples is provided for illustrative purposes and it is appreciated that suitable variations are contemplated.

The example illustrates marked constellation points form one group 301 which have different coset labels. At a receiver, the receiver uses a result of the inner code to decide between one of closest $2^{b_{lcm}}$ constellation points, while the remaining bits can be derived by a decision or hard decision according to the result of the inner decoder.

The QAM modulator 208 takes three input bit streams to modulate carriers with a constellation size b bits, $b_{lcm}$ bits per carrier (number of least significant bits) from the inner encoder 206, $b_k$ bits from the constellation shaping by the shell mapper 204 and the remaining $b-b_k-b_{lcm}$ bits from the outer code or the outer encoder 202.

If $b=b_{lcm}+b_k$, the bits are taken from the shaper/mapper 204 output and the inner encoder 206 (e.g., LDPC) output only and no bits are taken from the outer code. For $b<b_{lcm}+b_k$, the shaper/mapper 204 output is not used and bits are taken from the inner encoder 206 output and from the outer encoder 202 output. For b:::; b1cm, all bits are taken from the LDPC output.

FIG. 4 is a table 400 illustrating an example generation of QAM symbols in accordance with one or more embodiment. The example is provided for illustrative purposes and it is appreciated that suitable variations are contemplated.

This example has $b_{lcm}=2$ and $b_{lcm}=3$ and illustrates using the bits from different inputs to generate the QAM symbols by the modulator 208.

The table 400 depicts various values of b, from 1 to 7 and corresponding composition/bits from the inner encoder 206 and the outer encoder 202.

Generally, the shaper 206 can be disabled for smaller constellations because the shaping gain provided by the shaper 206 is substantially present for the larger constellation sizes.

The shaper 206 can be configured to divide the constellation into $N_k=2^{b_k}$ shells. Each shell contains the same number of constellation points in this example. Thus, for b=8 and $N_k=8$ ($b_k=3$) each shell includes $2^b/N_k=2^{b-b_k}=32$ constellation points.

Figure 5:
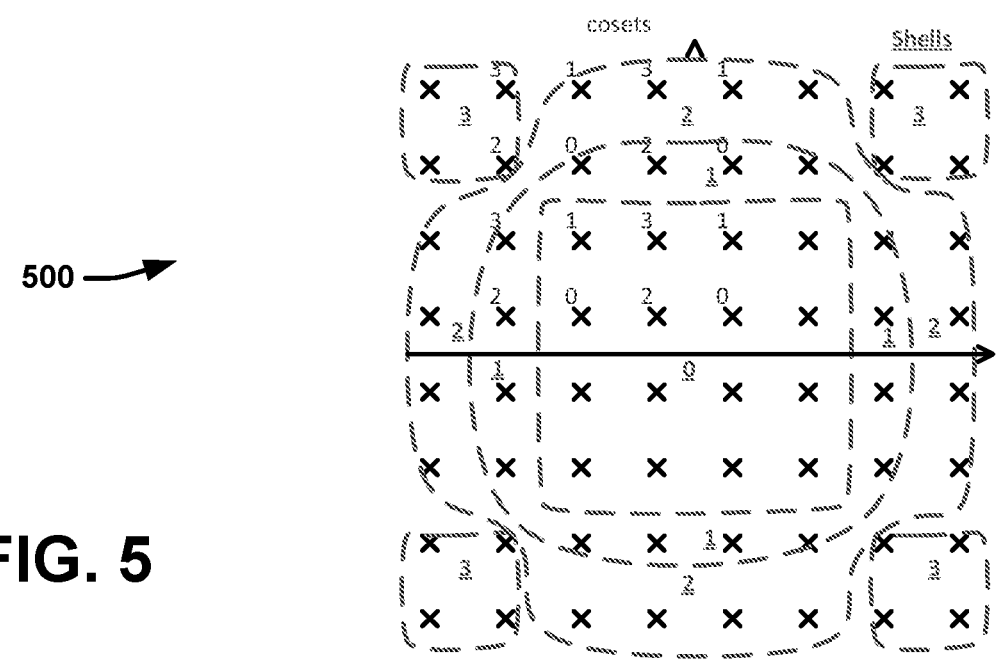
FIG. 5 is a diagram illustrating an example of shell mappings in accordance with one or more embodiments.

FIG. 5 is a diagram illustrating an example of shell mappings 500 in accordance with one or more embodiments. The mappings 500 are provided for illustrative purposes and it is appreciated that other suitable mappings are contemplated.

The mappings 500 can be generated by the shell mapper 204, described above.

It is appreciated that the shells are not required to be aligned with the cosets or coset labels.

The constellations can be constructed by the following rule:
1) Assign the coset labels for each constellation point with a regular pattern
2) For each coset label, sort the constellation points with ascending power
3) Assign an equal number of constellation points with each coset label to each shell
4) The number of constellation points per shell selected for each coset label is $2(b-b_k-b_{lcm})$ which is required to be greater or equal to one
5) For the case of $b<b_k+b_{lcm}$, no shell mapping is applied It is appreciated that the shell mapping scheme for constellation shaping does not require a specific bit mapping within the shell. This can be done in a way which is most convenient for hardware implementation.

In this example shown in FIG. 5, the shell mappings are for b=6 bits (6 bits per carrier). And result in 4 shells or shell mappings. The 4 shells are addressed with $b_k=2$ bits. Within the shell, the constellation points are addressed with $b_{lcm}=2$ bits for the coset labels 0, ..., 3 and the remaining 2 bits give the position within the shell.

The shell mapping, in one example, utilizes 4 shells for a b=6 bit constellation and 8 shells for constellations with b>6 bits.

To perform shell mapping, the shell mapper 204 is configured to assign shell bits for a group of $K_k$ carriers with respect to $b_{shell}$ input bits where $b_{shell}<b_k K_k$. The carriers in the carrier group can have different constellation sizes, as long as $b \geq b_k+b_{lcm}$ is satisfied. The degree of freedom gained by mapping a lower number of input bits to a higher number of shell bits is used to select those groups of shellbits for each group of carriers with the lowest energy.

To simplify the strategy, calculation of the actual energy of each shell can be omitted. Instead, ascending power values $i_k=0, \ldots, N_k-1$ can be assigned to each shell. From the $K_k N_k$ possible combinations of shell values for each group of $K_k$ carriers, those $2^{bshell}$ values with the lowest energy are selected.

In one example, the selection can be implemented in a look-up/lookup table (LUT).

Figure 6:
FIG. 6 is a table illustrating an example look-up table (LUT) in accordance with one or more embodiments.

FIG. 6 is a table 600 illustrating an example look-up table (LUT) in accordance with one or more embodiments. The LUT is provided for illustrative purposes and it is appreciated that suitable variations are contemplated.

The table 600 includes columns for input bits, shell 1, shell 2, sum power and outer shell label. Rows of associated values are shown.

The table 600 is shown with $2^{bshell}$ elements, $K_k=2$ and $N_k=4$ with $b_{shell}=3$. It is appreciated that other suitable look-up tables are contemplated that can be used by the shell mapper 204. The table 600 shows assignment of 3 input bits (labels 0, ..., 7) to 4 shell bits for $K_k=2$ carriers with $N_k=4$ shells per carrier.

The look-up table can be arranged in ascending order of input bits and shell bits. The shell mapper 204 is configured to map from an input bit sequence to an output bit sequence at the transmitter or encoder system. The input bit sequence is a sequence of input bits. The shell mapper 204 can be configured to map from a shell bit sequence to a received/output bit sequence when utilized at a decoder/receiver system.

When arranging a look-up table in ascending order of input bits as well as shell bits, it is easy to map from input bit sequence to shell bits at the transmitter and from shell bits to the output bit sequence at the receiver.

The look-up table can be computed and stored to reduce memory usage and the like.

Additional shaping gains can be achieved using a direct addressing scheme/technique.

Figure 7:
FIG. 7 is a table illustrating an example of a direct addressing scheme for the shell mapper in accordance with one or more embodiments.

FIG. 7 is a table 700 illustrating an example of a direct addressing scheme for the shell mapper 204 in accordance with one or more embodiments. The example is provided for illustrative purposes and it is appreciated that suitable variations are contemplated.

Generally, LUT table sizes beyond $b_{shell}=24$ (16.8 Million entries) are skipped. The assumptions are based on a b=13 base constellation.

To achieve shaping gains of more than 1 dB, $K_k \geq 16$ (number of carriers) with $b_k=3$ is required, which results in a look-up table that is too large and complex.

There are two techniques to achieve the higher shaping gains without a substantially large and complex table.

One possible solution (first technique) is a cascade of two shapers, e.g., to form super-groups $K_k$. $K_k$ carriers where the first shaping stage selects subsets for each of the subset groups and the second shaping stage finally selects the shells per carrier. The same LUT can be used, twice to perform this type of shaping, increasing the effective number of shaped carriers.

The technique works as follows: Each entry of the LUT is labeled with a shell label $0, \ldots, N_k-1$ while these labels are assigned with ascending order of the average shell power of the corresponding LUT entry. A number of $2^{b_{shell}-b_k}$ LUT entries have the same label, i.e., $2^{b_{shell}-b_k}$ LUT entries where the sum over the LUT entries is lowest, have label 0, the following $2^{b_{shell}-b_k}$ entries with high sum over the LUT entries have label 1 and so on. An example of this technique is shown in table 600 of FIG. 6.

The outer shell mapper 204 takes $b_{shell}$ bits per group of $K_k^2$ carriers and creates $K_k$ outer shell labels out of that. The inner shell label now uses $b_{shell}-b_k$ bits together with the assigned outer shell label to select the actual shells for each carrier in the group.

Thus the number of bits taken from the outer coder per group of K tor shell mapping is $(b_{shell}-b_k) K_k+b_{shell}$. The resulting carrier groups are much larger, but the resulting shaping is not the optimal or selected shaping, as it would result from one larger look-up-table. But this approach achieves shaping gains of more than one dB with minimal changes to the base line implementation. The theoretical shaping gains are summarized in FIG. 8.

Figure 8:
FIG. 8 is a table illustrating example shaping gains in accordance with one or more embodiments.

FIG. 8 is a table 800 illustrating example shaping gains in accordance with one or more embodiments.

The table 800 includes entries for $K_k^2$, $b_{shell}$ or $b_k=2$ Gain $b_k=2$. $b_{shell}$ for $b_k=2$ and Gain $b_k=3$.

Thus, the table 800 shows theoretical shaping gain values for selected values of $b_k$ and $K_k$ and $b_{shell}$ with two cascaded shapers using the same LUT.

Another approach to generating gain values is to use the mathematical structure of the LUT to store it. The mathematical structure can be used to generate multiple stages of different look-up tables to provide the same or similar shaping gain as one large LUT, but with a significantly reduced memory requirement.

In one example of using a mathematical structure, three steps/acts are used where an integer $I=0, \ldots, 2^{b_{shell}}-1$ is mapped to $K_k$ shell labels $0, \ldots, N_k-1$. In the first step, the sum of shell labels $$N_{k,sum} = \sum_{k=1}^{K_k} n_k^k$$

For the corresponding input bit sequence I is derived from a first look-up table LUT1. This first look-up table has a small number of entries, e.g, 21 entries for $K_k=16$ and $b_k=3$ with $b_{shell}=32$.

With known $N_{k,sum}$, a second look-up table LUT2 gives a list of weights for groups of shell bits. Each group contains $K_k$ bits and there are $b_k$ groups. These weights is the sum of ones of the $b_k$ bits of all carriers in the group.

For each weight, there is a certain or selected number of possible permutations of ones and zeros. These permutations are addressed in a third step. The third step can be done with a look-up table of $2^{K_k}$ entries or can be calculated.

Figure 9:
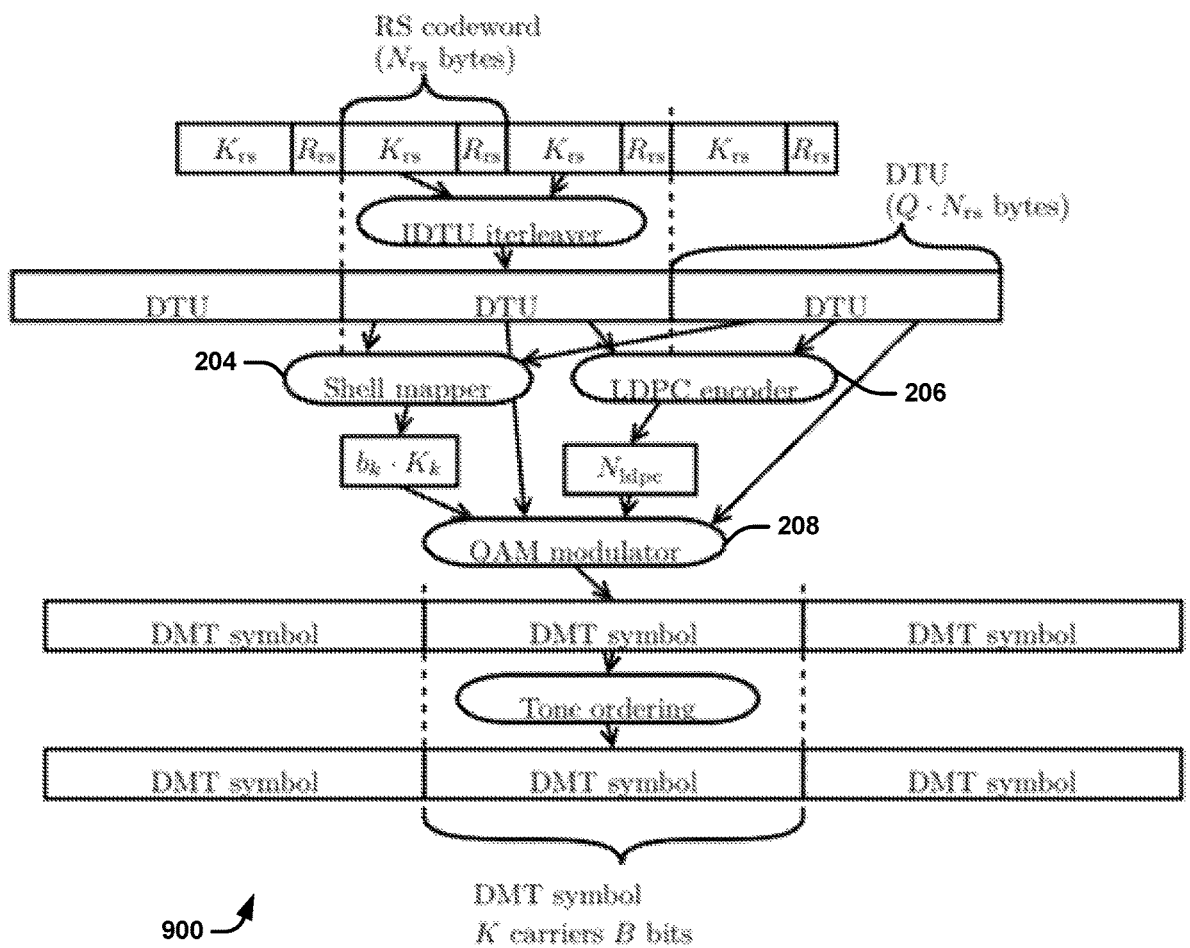
FIG. 9 is a diagram illustrating an example mapping of bits to symbols in accordance with one or more embodiments.

FIG. 9 is a diagram illustrating an example mapping 900 of bits to symbols in accordance with one or more embodiments. The symbols can be OFDM, DMT and the like. The illustrated mapping 900 is provided as an example for illustrative purposes and it is appreciated that suitable variations are contemplated.

It is appreciated that From the Reed-Solomon encoder 202 towards the DMT symbols modulation (inverse FFT), the data is re-organized and processed in multiple stages. These stages are shown in FIG. 9 where the blocks denote memories and the circles denote the processing functions.

In general, the data blocks are not required to align over the sub-layers (e.g. DTUs may not align with the inner LDPC code words and the shell mapper code words and the LDPC code words may not be aligned with the DMT symbols). However, alignment of the processing blocks reduces the buffering requirements.

The processing steps from the higher to the lower layer are as follows:

The outer code, e.g., Reed-Solomon Code takes $K_{rs}$ data bytes from the layer 2 and generates $N_{rs}$ encoded bytes from that.

Multiple code words of the outer code are combined in a data transmission unit (DTU) and interleaving is applied within the DTU to increase robustness against burst errors.

The shell mapper 206 receives $b_{shell}$ bits from the DTU buffer and converts them into $K_k \cdot b_k$ bits for the QAM modulator 208.

The LDPC encoder 206 receives $K_{ldpc}$ bits from the DTU buffer andconverts that into $N_{ldpc}$ output bits for the QAM modulator 208.

It is appreciated that a TCM encoder can be used instead of the LDPC encoder.

The QAM modulator 208 receives for each DMT symbol with K carriers $2N_{b>1}+N_{b=1}$ bits from the LDPC output buffer, where $N_{b>1}$ is the number of carriers with bit allocation b>0 in the DMT symbol and $N_{b=1}$ is the number of 1-bit carriers in the DMT symbol. In addition, the QAM modulator 208 receives $b_k N_{b>b_{1cm}+b^k}$ from the shell mapper 204 output buffer, where $N_{b>b_{1cm}+b_k}$ is the number of carriers with bit allocation $b>b_{1cm}+b_k$. Finally, the QAM modulator 208 receives or obtains the remaining bits, which are $$\sum_{b>b_{1cm}+b_k} b - b_{1cm} - b_k + \sum_{b>b_{1cm} \text{ and } b<b_{1cm}+b_k} b - b_{1cm} \text{ bits,}$$

directly from the DTU buffer.

In a last step, the tone ordering is mapped from the QAM modulator 208 output to the DMT symbol in natural tone order (first tone is the lowest frequency and last tone is the highest frequency).

The tone ordering can be used to equalize margin among the carriers by grouping carriers with lower and higher SNR margin together in one tone block of the shell mapper. Similarly, the intra-DTU interleaver can help to correct error bursts due to a mis-detection of the shell mapping decoder. For that, the shell mapping bits are taken as one block from the DTU buffer.

The data rates are given as follows: At the DMT symbol encoder, the data rate is given by $$R_{dmt} = \frac{1}{t_{sym}} \sum_{k=1}^{K} b^{(k)} \quad (1)$$

where $t_{sym}$ is the length of a DMT symbol in time and $b^{(k)}$ is the bit allocation on carrier k.

The effective number of bits per DMT symbol when correcting for the LDPC and shell mapper overhead is given by $$R_{DTU} = \frac{1}{t_{sym}} \sum_{k=1}^{K} b_{eff}^{(k)} \quad (2)$$

where the effective number of bits per carrier $b_{eff}^{(k)}$ is given by $$b_{eff}^{(k)} = \begin{cases} b \frac{K_{1dpc}}{N_{1dpc}} & \text{for } b \leq b_{1cm} \\ b_{1cm} \frac{K_{1dpc}}{N_{1dpc}} + b - b_{1cm} & \text{for } b_{1cm} < b < b_{1cm} + b_k \\ b_{1cm} \frac{K_{1dpc}}{N_{1dpc}} + b - b_{1cm} - b_k + \frac{b_{ahell}}{K_k} & \text{for } b \text{ geq} b_{1cm} + b_k \end{cases} \quad (3)$$

The data rate at the outer FEC input is thus given by:

$$R_{RS} = \frac{K_{rs}}{N_{rs}} \frac{1}{t_{sym}} \sum_{k=1}^{K} b_{eff}^{(k)} \quad (4)$$

Additionally, the layer one input rate (y interface) is equal to that rate (plus overhead added in the DTU, if any). There is a fixed dependency between $b^{(k)}$ and $b_{eff}^{(k)}$ such that the number of payload bits transmitted per DMT symbol and thus the data rate is constant.

Figure 10:
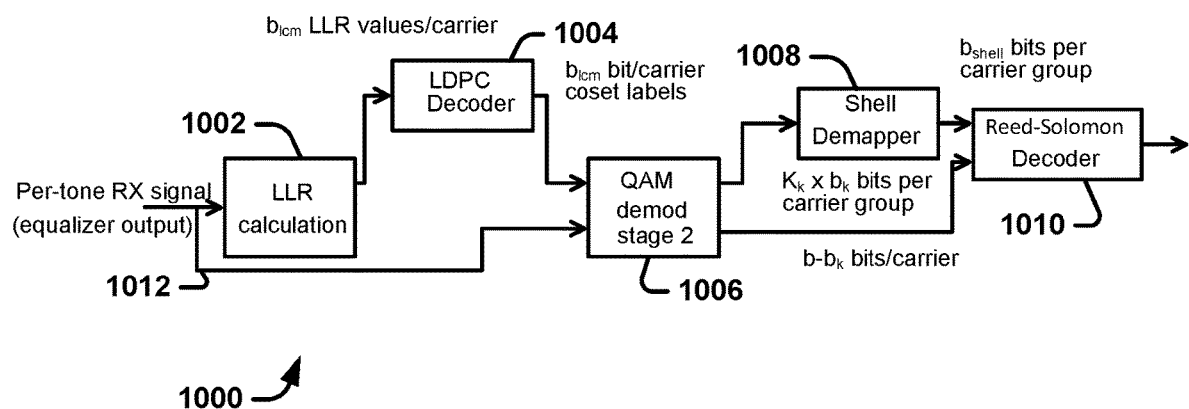
FIG. 10 is a diagram illustrating a decoder system for a receiver in accordance with one or more embodiments.

FIG. 10 is a diagram illustrating a decoder system 1000 for a receiver in accordance with one or more embodiments. The system 1000 is provide as an example for illustrative purposes and it is appreciated that suitable variations are contemplated.

The system 1000 includes an LLR calculation circuit 1002, an LDPC or inner decoder 1004, a QAM demodulation stage 2 1006, a shell demapper 1008 and a Reed-Solomon decoder 1010. The system 1000 obtains a receive signal and generates a demodulated or baseband signal as its output.

The receive signal (from a line) can be transformed to frequency domain and a receive equalizer scales the per-tone signal to match the constellation grid. Thus, the receive signal is transformed and scaled and provided as an input 1012 to the LLR calculation circuit 1002 and the QAM demodulation stage 2 1006.

The inner decoder 1004 is configured to decode the received signal using an inner code (LDPC) and generate an inner decoded signal. The demodulation stage 1006 is configured to demodulate the received signal using the inner decoded signal to generate a demodulated signal. The shell demapper 1008 is configured to demap at least a subset of the demodulated signal according to carrier group and to generate a demapped signal. The outer decoder 1010 is configured to decode the demodulated signal using the demapped signal to generate an outer decoded signal.

The QAM demodulation can utilize two stages or acts because of an LCM or TCM inner error correction code.

In a first stage, log-likelihood ratios (LLRs) of the $b_{1cm}$ receive bits per carrier are derived by the LLR calculation circuitry 1002 from the knowledge of the noise variance $\sigma^{(k),2}$ of carrier k and the position of the receive signal point on the constellation grid. The derived values are provided to the LDPC decoder 1004. When all receive LLR values for one LDPC code block have been received, the LDPC decoder 1004 operates and generates final decision coset labels.

The log-likelihood ratio (LLR) is the input format for the (soft decision) LDPC decoder. It is one value per bit and describes a probability that a transmitted bit was a 1 or a 0, dependent on the received signal. As an example for a given receive signal, there is a probability p0 that the transmitted bit was 0 and a probability p1 that the transmitted bit was 1, the log-likelihood ratio is log(p0)-log(p1). The value is negative in case that the bit is more likely to be zero and it is negative when is more likely that the transmitted bit was one. In case that there is no knowledge on the transmitted bit, e.g., an erasure, the LLR value is 0.

The second stage of QAM demodulation is performed by the QAM demodulation stage 2 1006. The QAM stage 2 1006 is configured to receive the coset labels and the signal 1012. The QAM stage 2 performs a hard decision of the receive signal points to the closest constellation points with a corresponding coset label. This is based on the assumption that the LDPC decoder output is error-free.

The $b_k$ bits per carrier (which determine the constellation shell) are collected for each group of $K_k$ carriers and forwarded to the shell demapper 1008. For each carrier group, the shell demapper 1008 searches for the entry in a shell mapping look-up table that gives the best fit.

If none of the LUT entries matches the $b_k K_k$ shell map bits from the receiver, a receive error has occurred and one or more techniques can be used to determine the shell mapper input bit sequence which has been transmitted with the highest probability. Several shell mapper input sequence determination techniques are listed below:

1. Search for a LUT entry with the smallest Hamming distance to the received shell bits
2. Search for a LUT entry with the smallest metric distance between the received constellation points of the corresponding carrier group and the transmit signal resulting from the selected LUT entry together with the other hard decision bits.
3. Search for a LUT entry with a highest log-likelihood ratio for the received constellation points.

It is appreciated that the first technique above can result in multiple LUT entries with the same Hamming distance. In such a case, an additional shell mapper input sequence determination technique can be used to obtain a final decision for one LUT entry.

With the data bits from the shell demapper 1008 and the hard decision output from the second stage of the QAM demodulator 1006, the receive DTUs are formed and after de-interleaving and the Reed-Solomon decoding is performed at the decoder 1010. The resulting data bits are forwarded to the layer 2, in one example.

It is appreciated that suitable variations of the decoder system 1000 are contemplated. Further, the above figures can be referenced for further description of the decoder system 1000.

Additionally, it is appreciated that the decoder system 1000 can mirror the encoder system 200. Further, the decoder system 1000 can also be modified for operation as an encoder.

As utilized above and herein, terms "component," "system," "interface," and the like are intended to refer to a computer-related entity, hardware, software (e.g., in execution), and/or firmware. For example, a component can be a processor, a process running on a processor, a controller, an object, an executable, a program, a storage device, and/or a computer with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Furthermore, to the extent that the terms "including", "includes", "having", "has", "with", or variants thereof are used in either the detailed description and the claims, such terms are intended to be inclusive in a manner similar to the term "comprising".

As used herein, the term "circuitry" may refer to, be part of, or include an Application Specific Integrated Circuit (ASIC), an electronic circuit, a processor shared,)dedicated, or group), and/or memory (shared, dedicated, or group) that execute one or more software or firmware programs, a logic circuit, combinational and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

As it employed in the subject specification, the term "processor" can refer to substantially any computing processing unit or device including, but not limited to including, single-core processors; single-processors with software multithread execution capability; multi-core processors; multi-core processors with software multithread execution capability; multi-core processors with hardware multithread technology; parallel platforms; and parallel platforms with distributed shared memory. Additionally, aprocessor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions and/or processes described herein. Processors can exploit nano-scale architectures such as, but not limited to, molecular and quantum-dot based transistors, switches and gates, in order to optimize space usage or enhance performance of mobile devices. A processor may also be implemented as a combination of computing processing units.

In the subject specification, terms such as "store," "data store," data storage," "database," and substantially any other information storage component relevant to operation and functionality of a component and/or process, refer to "memory components," or entities embodied in a "memory," or components including the memory. It is noted that the memory components described herein can be either volatile memory or nonvolatile memory, or can include both volatile and nonvolatile memory.

By way of illustration, and not limitation, nonvolatile memory, for example, can be included in a memory, nonvolatile memory (see below), disk storage (see below), and memory storage (see below). Further, nonvolatile memory can be included in read only memory, programmable read only memory, electrically programmable read only memory, electrically erasable programmable read only memory, or flash memory. Volatile memory can include random access memory, which acts as external cache memory. By way of illustration and not limitation, random access memory is available in many forms such as synchronous random access memory, dynamic random access memory, synchronous dynamic random access memory, double data rate synchronous dynamic random access memory, enhanced synchronous dynamic random access memory, Synchlink dynamic random access memory, and direct Rambus random access memory. Additionally, the disclosed memory components of systems or methods herein are intended to include, without being limited to including, these and any other suitable types of memory.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is a multi-carrier transmitter apparatus. The apparatus includes an outer encoder, a shell mapper and an inner encoder. The outer encoder is configured to receive a signal, perform error correction using an outer code on the received signal and generate an outer encoder signal. The shell mapper is configured to perform constellation shaping on a subset of bits from the outer encoder signal and generate one or more constellation shaping bits in a shell mapper signal. The inner encoder is configured to perform inner error correction using an inner code on a second subset of bits from the outer encoder signal and generate an inner correction signal.

Example 2 includes the subject matter of Example 1, including or omitting optional elements, wherein the outer code is a Reed-Solomon code or a BCH code.

Example 3 includes the subject matter of any of Examples 1-2, including or omitting optional elements, wherein the inner code is LPDC.

Example 4 includes the subject matter of any of Examples 1-3, including or omitting optional elements, wherein the shell mapper is configured to operate on one or more carrier blocks and utilize a constant number of bits per carrier block.

Example 5 includes the subject matter of any of Examples 1-4, including or omitting optional elements, wherein the shell mapper is configured to provide a constant input bit rate and a constant output bit rate per symbol.

Example 6 includes the subject matter of any of Examples 1-5, including or omitting optional elements, wherein carrier blocks at the shell mapper are aligned with DMT symbols.

Example 7 includes the subject matter of any of Examples 1-6, including or omitting optional elements, wherein the shell mapper is configured to perform constellation shaping based on an absolute distance between constellation points and one or more constellation points from a look-up table.

Example 8 includes the subject matter of any of Examples 1-7, including or omitting optional elements, wherein the shell mapper is configured to use variable bit loading based on a plurality of carriers.

Example 9 includes the subject matter of any of Examples 1-8, including or omitting optional elements, further comprising a QAM modulator configured to generate one or more modulated symbols in an output signal based on the received outer encoder signal, the shell mapper signal and the inner correction signal.

Example 10 includes the subject matter of any of Examples 1-9, including or omitting optional elements, wherein the QAM modulator is configured to generate one or more QAM constellations arranged in shell grouping constellation points.

Example 11 includes the subject matter of any of Examples 1-10, including or omitting optional elements, wherein the one or more QAM constellations include one or more even constellations based on square QAM constellations having equal distances between neighboring constellation points.

Example 12 includes the subject matter of any of Examples 1-11, including or omitting optional elements, wherein the one or more QAM constellations include one or more odd constellations based on a selected subset of constellation points having a low signal power.

Example 13 includes the subject matter of any of Examples 1-12, including or omitting optional elements, wherein the QAM modulator utilizes a tone order to modulate and generate the output signal.

Example 14 includes the subject matter of any of Examples 1-13, including or omitting optional elements, wherein the outer encoder is configured to combine multiple codewords of the outer code in a data transmission unit (DTU).

Example 15 is a multi-carrier receiver apparatus for decoding and includes an inner decoder, a demodulation stage, a shell demapper, and an outer decoder. The inner decoder is configured to decode a received signal using an inner code to generate an inner decoded signal. The demodulation stage is configured to demodulate the received signal using the inner decoded signal to generate a demodulated signal. The shell mapper is configured to demap at least a subset of the demodulated signal according to carrier group to generate a demapped signal. The outer decoder is configured to decode the demodulated signal using the demapped signal to generate an outer decoded.

Example 16 includes the subject matter of Example 15, including or omitting optional elements, further comprising a log-likelihood-ratio circuitry configured to determine log-likelihood-ratios (LLR) for coset bits from the receive signal and providing the determined LLR to the inner decoder.

Example 17 includes the subject matter of any of Examples 15-16, including or omitting optional elements, wherein the shell demapper is configured to determine one or more coset bits based on the outer encoder signal.

Example 18 includes the subject matter of any of Examples 15-17, including or omitting optional elements, wherein the shell demapper is configured to obtain one or more shell bits for each shell-mapping carrier group and search the one or more shell bits to identify shell bits that match the received shell match bits.

Example 19 is a method of coding a transmit signal for multiple carriers. The method includes applying an outer code to an input signal to generate an outer encoder signal, where the outer code is a hard code; applying an inner code to a subset of bits from the outer encoder signal to generate an inner correction signal; performing constellation shaping on a second subset of bits from the outer encoder signal by shell mapper circuitry to generate a shell mapper signal having one or more constellations per carrier of a plurality of carriers; and modulating the outer encoder signal, the inner correction signal and the shell mapper signal to generate an output signal for transmission.

Example 20 includes the subject matter of Example 19, including or omitting optional elements, wherein the shaping is performed based on carrier blocks of the plurality of carriers using a constant or variable number of bits per carrier.

Example 21 includes the subject matter of any of Examples 19-20, including or omitting optional elements, wherein the second subset for the shaping includes a selected number of bits for modulation.

Example 22 includes the subject matter of any of Examples 19-21, including or omitting optional elements, wherein the shaping further includes referencing a look-up table based on a fixed number of bits of the second subset to select a shell of a plurality of shells.

Example 23 includes the subject matter of any of Examples 19-22, including or omitting optional elements, wherein the shaping further includes determining energy values for each group of carriers and selecting a shell of a plurality of shells for each group of carriers based on the energy values.

Example 24 includes the subject matter of any of Examples 19-23, including or omitting optional elements, wherein the second subset of bits includes a plurality of assignment of input bits to shell bits.

Example 25 includes the subject matter of any of Examples 19-24, including or omitting optional elements, wherein the shaping utilizes a cascade of two or more shapers to form super groups, wherein a first shaping selects subsets for each of the super groups and a second shaping selects shells for the selected subsets.

Example 26 is an apparatus for coding a transmit signal for multiple carriers. The apparatus includes a means for applying an outer code to an input signal to generate an outer encoder signal; a means for applying an inner code to a subset of bits from the outer encoder signal to generate an inner correction signal; and a means for performing constellation shaping on a second subset of bits from the outer encoder signal by shell mapper circuitry to generate a shell mapper signal having one or more constellations per carrier of a plurality of carriers.

Example 27 includes the subject matter of Example 26, including or omitting optional elements, further comprising a means for modulating the outer encoder signal, the inner correction signal and the shell mapper signal to generate an output signal for transmission.

Example 28 includes the subject matter of any of Examples 26-27, including or omitting optional elements, further comprising a means for determining energy values for each group of carriers and selecting a shell of a plurality of shells for each group of carriers based on the energy values.

Example 29 is a multi-carrier receiver apparatus for decoding. The apparatus includes a means to decode a received signal using an inner code to generate an inner decoded signal; a means to demodulate the received signal using the inner decoded signal to generate a demodulated signal; a means to demap at least a subset of the demodulated signal according to carrier group to generate a demapped signal; and a means to decode the demodulated signal using the demapped signal to generate an outer decoded signal.

Example 30 includes the subject matter of Example 29, including or omitting optional elements, wherein the apparatus is a wired communication system.

Example 31 includes the subject matter of any of Examples 29-30, including or omitting optional elements, wherein wired communication system is a digital subscriber line (DSL).

Example 32 is one or more computer-readable media having instructions that, when executed, cause a multi-carrier transmitter to receive a signal; perform error correction using an outer code on the received signal and generate an outer encoder signal; perform constellation shaping on a subset of bits from the outer encoder signal and generate one or more constellation shaping bits in a shell mapper signal; and perform inner error correction using an inner code on a second subset of bits from the outer encoder signal and generate an inner correction signal.

Example 33 includes the subject matter of Example 32, including or omitting optional elements, further comprising to operate on one or more carrier blocks and utilize a constant number of bits per carrier block.

Example 34 includes the subject matter of any of Examples 32-33, including or omitting optional elements, further comprising to generate one or more modulated symbols in an output signal based on the received outer encoder signal, the shell mapper signal and the inner correction signal.

It is to be understood that aspects described herein can be implemented by hardware, software, firmware, or any combination thereof. When implemented in software, functions can be stored on or transmitted over as one or more instructions or code on a computer-readable medium. Computer-readable media includes both computer storage media and communication media including any medium that facilitates transfer of a computer program from one place to another. A storage media or a computer readable storage device can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or other tangible and/or non-transitory medium, that can be used to carry or store desired information or executable instructions. Also, any connection is properly termed a computer-readable medium. For example, if software is transmitted from a website, server, or other remote source using a coaxial cable, fiber optic cable, twisted pair, digital subscriber line (DSL), or wireless technologies such as infrared, radio, and microwave, then coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration. Additionally, at least one processor can comprise one or more modules operable to perform one or more of the s and/or actions described herein.

For a software implementation, techniques described herein can be implemented with modules (e.g., procedures, functions, and so on) that perform functions described herein. Software codes can be stored in memory units and executed by processors. Memory unit can be implemented within processor or external to processor, in which case memory unit can be communicatively coupled to processor through various means as is known in the art. Further, at least one processor can include one or more modules operable to perform functions described herein.

Techniques described herein can be used for various wireless communication systems such as CDMA, TOMA, FDMA, OFDMA, SC-FDMA and other systems. The terms "system" and "network" are often used interchangeably. A CDMA system can implement a radio technology such as Universal Terrestrial Radio Access (UTRA), CDMA1800, etc. UTRA includes Wideband-CDMA (W-CDMA) and other variants of CDMA. Further, CDMA1800 covers IS-1800, IS-95 and IS-856 standards. A TOMA system can implement a radio technology such as Global System for Mobile Communications (GSM). An OFDMA system can implement a radio technology such as Evolved UTRA (E-UTRA), Ultra Mobile Broadband (UMB), IEEE 802.11 (Wi-Fi), IEEE 802.16 (WiMAX), IEEE 802.18, Flash-OFDM, etc. UTRA and E-UTRA are part of Universal Mobile Telecommunication System (UMTS). 3GPP Long Term Evolution (LTE) is a release of UMTS that uses E-UTRA, which employs OFDMA on downlink andSC-FDMA on uplink. UTRA, E-UTRA, UMTS, LTE and GSM are described in documents from an organization named "3rd Generation Partnership Project" (3GPP). Additionally, CDMA1800 and UMB are described in documents from an organization named "3rd Generation Partnership Project 2" (3GPP2). The techniques can also be used with new radio (NR) 5G, also from the 3GPP organization. Further, such wireless communication systems can additionally include peer-to-peer (e.g., mobile-to-mobile) ad hoc network systems often using unpaired unlicensed spectrums, 802.xx wireless LAN, BLUETOOTH and any other short- or long-range, wireless communication techniques.

Single carrier frequency division multiple access (SC-FDMA), which utilizes single carrier modulation and frequency domain equalization is a technique that can be utilized with the disclosed aspects. SC-FDMA has similar performance and essentially a similar overall complexity as those of OFDMA system. SC-FDMA signal has lower peak-to-average power ratio (PAPR) because of its inherent single carrier structure. SC-FDMA can be utilized in uplink communications where lower PAPR can benefit a mobile terminal in terms of transmit power efficiency.

Moreover, various aspects or features described herein can be implemented as a method, apparatus, or article of manufacture using standard programming and/or engineering techniques. The term "article of manufacture" as used herein is intended to encompass a computer program accessible from any computer-readable device, carrier, or media. For example, computer-readable media can include but are not limited to magnetic storage devices (e.g., hard disk, floppy disk, magnetic strips, etc.), optical disks (e.g., compact disk (CD), digital versatile disk (DVD), etc.), smart cards, and flash memory devices (e.g., EPROM, card, stick, key drive, etc.). Additionally, various storage media described herein can represent one or more devices and/or other machine-readable media for storing information. The term "machine-readable medium" can include, without being limited to, wireless channels and various other media capable of storing, containing, and/or carrying instruction(s) and/or data. Additionally, a computer program product can include a computer readable medium having one or more instructions or codes operable to cause a computer to perform functions described herein.

Communications media embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

Further, the actions of a method or algorithm described in connection with aspects disclosed herein can be embodied directly in hardware, in a software module executed by a processor, or a combination thereof. A software module can reside in RAM memory, flash memory, ROM memory, EPROM memory, EEPROM memory, registers, a hard disk, a removable disk, a CD-ROM, or any other form of storage medium known in the art. An exemplary storage medium can be coupled to processor, such that processor can read information from, and write information to, storage medium. In the alternative, storage medium can be integral to processor. Further, in some aspects, processor and storage medium can reside in an ASIC. Additionally, ASIC can reside in a user terminal. In the alternative, processor and storage medium can reside as discrete components in a user terminal. Additionally, in some aspects, the s and/or actions of a method or algorithm can reside as one or any combination or set of codes and/or instructions on a machine-readable medium and/or computer readable medium, which can be incorporated into a computer program product.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

What is claimed is:

1. An apparatus, comprising:
    an encoder configured to perform error correction using an error correction code on a received signal to generate an encoder signal;
    a shell mapper configured to perform shaping on the received signal over two or more groups of carriers with different constellation sizes to generate a shaped signal; and
    a modulator configured to generate an output signal based on the encoder signal and the shaped signal.

2. The apparatus of claim 1, the error correction code being selected from a group of forward error correction (FEC) codes.

3. The apparatus of claim 1, the shaping including at least one of probabilistic shaping or constellation shaping.

4. The apparatus of claim 1, the shaped signal including one or more constellation shaping bits.

5. The apparatus of claim 4, the error correction code including an outer code, the shaping bits being protected with the outer code.

6. The apparatus of claim 1, the error correction being performed on a subset of bits of the received signal.

7. The apparatus of claim 1, wherein the shell mapper is disabled when the constellation size is below a threshold constellation size, the modulator being configured to adaptively generate the output signal without the shaped signal when the shell mapper is disabled.

8. The apparatus of claim 1, the error correction code to protect one or more least significant bits (LSBs) of each constellation.

9. The apparatus of claim 1, the error correction code in combination with interleaving is to correct at least one of an: error bursts, or an error due to an un-protected bit.

10. The apparatus of claim 1, the shaping to be performed on fewer than all of the bits of the received signal.

11. The apparatus of claim 1, wherein the shaping is performed based on carrier blocks of the plurality of carriers using a constant or variable number of bits per carrier.

12. The apparatus of claim 1, wherein the shaping further includes referencing a look-up table based on a fixed number of bits to select a shell of a plurality of shells.

13. The apparatus of claim 12, wherein constellations are to be partitioned into the plurality of shells.

14. The apparatus of claim 1, wherein the shaping utilizes a cascade of two or more shapers to form a plurality of super groups, wherein a first shaping selects subsets of bits for each super group of the plurality of super groups and a second shaping selects shells for the selected subsets.

15. An apparatus, comprising:
    a demodulation stage configured to demodulate a received signal to generate a demodulated signal, the received signal having been generated based on an encoder signal and a shaped signal;
    a shell demapper configured to demap at least a subset of the demodulated signal according to a carrier group to generate a demapped signal; and
    a decoder configured to decode the received signal using the demapped signal.

16. The apparatus of claim 15, wherein the shell demapper is configured to obtain one or more shell bits for the carrier group and search the one or more shell bits to identify matching shell bits.

17. The apparatus of claim 15, the shaped signal having been generated using at least one of probabilistic shaping or constellation shaping.

18. A method, comprising
    performing error correction on a received signal using an error correction code to generate an encoder signal;
    performing shaping on the received signal over two or more groups of carriers with different constellation sizes to generate a shaped signal; and
    generating an output signal based on the encoder signal and the shaped signal.

19. The method of claim 18, wherein generating the output signal includes generating one or more modulated symbols in the output signal.

20. The method of claim 18, the error correction code in combination with interleaving is to correct at least one of an: error bursts, or an error due to an un-protected bit.

* * * * *